(12) United States Patent
James

(10) Patent No.: US 7,927,923 B2
(45) Date of Patent: Apr. 19, 2011

(54) METHOD AND APPARATUS FOR DIRECTING MOLDING COMPOUND FLOW AND RESULTING SEMICONDUCTOR DEVICE PACKAGES

(75) Inventor: Stephen L. James, Boise, ID (US)

(73) Assignee: Micron Technology, Inc., Boise, ID (US)

(*) Notice: Subject to any disclaimer, the term of this patent is extended or adjusted under 35 U.S.C. 154(b) by 808 days.

(21) Appl. No.: 11/526,520

(22) Filed: Sep. 25, 2006

(65) Prior Publication Data

US 2008/0073758 A1 Mar. 27, 2008

(51) Int. Cl.
H01L 21/44 (2006.01)
H01L 21/48 (2006.01)

(52) U.S. Cl. ........ 438/124; 438/117; 438/126; 438/127; 257/667; 257/676; 257/678; 257/787; 257/E21.503; 257/E21.504; 257/E23.069; 257/E23.125

(58) Field of Classification Search ................. 438/117, 438/124, 126, 127; 257/667, 676, 678, 787, 257/E21.503, E21.504, E23.069, E23.125
See application file for complete search history.

(56) References Cited

U.S. PATENT DOCUMENTS

| | | | |
|---|---|---|---|
| 4,641,418 A | 2/1987 | Meddles | |
| 4,894,704 A | 1/1990 | Endo | |
| 4,919,857 A | 4/1990 | Hojyo | |
| 5,091,341 A | 2/1992 | Asada et al. | |
| 5,153,706 A | 10/1992 | Baba et al. | |
| 5,197,183 A | 3/1993 | Chia et al. | |
| 5,288,698 A | 2/1994 | Banjo et al. | |
| 5,371,044 A * | 12/1994 | Yoshida et al. | 264/272.17 |
| 5,741,530 A | 4/1998 | Tsunoda | |
| 5,808,354 A | 9/1998 | Lee et al. | |
| 5,864,776 A | 1/1999 | Warren, Jr. et al. | |
| 5,926,695 A | 7/1999 | Chu et al. | |
| 5,965,078 A | 10/1999 | Bolanos et al. | |
| 5,977,613 A | 11/1999 | Takata et al. | |
| 6,074,072 A | 6/2000 | Parsons et al. | |
| 6,173,490 B1 * | 1/2001 | Lee et al. | 29/841 |
| 6,187,614 B1 | 2/2001 | Takata et al. | |
| 6,215,174 B1 | 4/2001 | Takada et al. | |
| 6,278,175 B1 | 8/2001 | James | |
| 6,316,821 B1 | 11/2001 | Chang et al. | |
| 6,451,629 B2 | 9/2002 | James | |
| 6,455,933 B1 * | 9/2002 | Akram et al. | 257/738 |
| 6,649,447 B1 | 11/2003 | Chang et al. | |
| 6,776,598 B2 | 8/2004 | Park et al. | |
| 6,815,835 B2 | 11/2004 | James | |
| 6,894,370 B2 | 5/2005 | Kiyohara | |
| 6,987,058 B2 * | 1/2006 | Hall | 438/617 |
| 2003/0201525 A1 | 10/2003 | James et al. | |
| 2005/0133895 A1 * | 6/2005 | Ujiie et al. | 257/678 |
| 2006/0006550 A1 * | 1/2006 | Joshi | 257/778 |

* cited by examiner

Primary Examiner — Dao H Nguyen
(74) Attorney, Agent, or Firm — TraskBritt

(57) ABSTRACT

Flow diverting structures for preferentially impeding, redirecting or both impeding and redirecting the flow of flowable encapsulant material, such as molding compound, proximate a selected surface or surfaces of a semiconductor die or dice during encapsulation are disclosed. Flow diverting structures may be included in or associated with one or more portions of a lead frame, such as a paddle, tie bars, or lead fingers. Flow diverting structures may also be inserted into a mold in association with semiconductor dice carried on non-lead frame substrates, such as interposers and circuit boards, to preferentially impede, redirect or both impede and redirect the flow of molding compound flowing between and over the semiconductor dice.

9 Claims, 7 Drawing Sheets

METHOD AND APPARATUS FOR DIRECTING MOLDING COMPOUND FLOW AND RESULTING SEMICONDUCTOR DEVICE PACKAGES

BACKGROUND OF THE INVENTION

1. Field of the Invention

Embodiments of the present invention relate generally to the packaging of semiconductor dice. More particularly, embodiments of the present invention relate to methods and apparatus for redirecting a flow of a molding compound, such as a resin, in a mold cavity, and resulting semiconductor device packages.

2. State of the Art

Semiconductor dice are created from wafers, such as silicon wafers, as well as from other bulk semiconductor substrates, using a sequence of material deposition and removal acts that are well known to those of ordinary skill in the art. Ultimately, the completed semiconductor dice may be packaged for many applications by encapsulating one or more semiconductor dice in a resin-based molding compound comprising, conventionally, a silicon particle-filled thermoplastic resin.

One approach to packaging of semiconductor dice utilizes a lead frame. Lead frames are generally thin metallic layers, although metal-coated polymer film lead frames are also known. In the center of some lead frames is a so-called "die paddle" upon which one or more semiconductor dice may be mounted, such as by an adhesive or a solder. Lead fingers, or leads, are disposed adjacent one or more sides of the die paddle. The paddle is isolated from the remainder of the lead frame except by members called tie bars, which are used to initially support the lead frame when in strip form with other identical lead frames, before encapsulation of the die or dice and a subsequent trim and form operation wherein the lead frame lead fingers as well as the die paddle are severed from a surrounding, supporting structure. The lead fingers, when a lead frame is in strip form and during encapsulation of a semiconductor die or dice carried thereon, are separated from each other by intervening, supporting dam bars, which are also severed during the trim and form operation.

Once a semiconductor die is secured to the die paddle and wire-bonded or otherwise electrically connected to the lead fingers, each resulting assembly, in strip form with a plurality of identical assemblies, is then placed in a mold cavity of a plurality of mold cavities defined between opposing segments of a mold of a transfer molding apparatus. Molten molding compound, comprising the aforementioned silicon particle-filled thermoplastic resin, is injected under pressure into the mold cavity to encapsulate and form a package around the semiconductor die and the plurality of lead fingers. The packaged semiconductor die is removed from the mold and separated from the lead frame in the aforementioned trim and form operation, wherein the lead fingers may also be conventionally formed into a final configuration to facilitate connection of the outer ends thereof to higher-level packaging. The packaged semiconductor die is then available for use, such as in mounting to a printed circuit board (PCB) or to other higher-level packaging.

Other lead frame configurations, such as so-called leads-over-chip (LOC) configurations, wherein no die paddle is employed and lead fingers of a lead frame are adhered to an active surface of a semiconductor die with inner ends thereof proximate a central row or rows of bond pads. A similar configuration, known as a lead-under-chip (LUC) configuration, likewise does not employ a die paddle, and the lead fingers extend under and are adhered to a back side of a semiconductor die. Another configuration is a so-called "leads between chip" configuration, wherein a lead frame (with or without paddle) is interposed between semiconductor dice on opposing sides thereof. The encapsulation process, followed by trim and form, is generally the same for these semiconductor device assembly configurations as for die paddle-type assemblies.

A problem with current packaging processes is that mold cavity configurations and tolerance variances, semiconductor die shapes and sizes, the presence of more than one semiconductor die to be encapsulated, and the configuration and orientation of the lead frame elements may lead to uneven flow of resin inside a mold cavity, resulting in an uneven distribution of resin around the semiconductor die or dice and the lead frame in the mold cavity. The resulting voids, knit lines, and pinholes in the resin encapsulant structure can compromise the integrity of the packaging around the semiconductor die or dice and can also adversely affect heat transfer characteristics of the package.

To further explain how the aforementioned defects may occur, a conventional mold comprises a plurality of mold cavities defined between a top mold plate and a bottom mold plate. The semiconductor dice assembled with, and electrically connected to, lead frames carried by a supporting structure of a lead frame strip, are disposed in the mold cavities with the supporting structure outside the cavities and connected to the assemblies by tie bars and lead fingers. The molding compound is introduced into each mold cavity through one or more "gates," or openings, leading to the cavity, generally from one side of the mold cavity and displacing air in the mold cavity out through one or more apertures, also termed vents, in the opposing side of the cavity, although vertically oriented mold cavities are known. In any case, the aforementioned variables in the mold cavities as well as in the semiconductor die assemblies placed therein may cause the flow front of the pressurized molding compound to accelerate around the sides of each assembly, particularly if the assemblies include a stack of semiconductor dice, leaving the top and bottom of the stacks inadequately encapsulated. This phenomenon is due to the relative difference in resistance to molding compound flow provided by the relatively larger cross-sectional areas to the sides of the die stack provided by the mold cavity in comparison to the smaller cross-sectional areas, above and below, between the stack and the mold cavity walls.

Additionally, semiconductor dice and their corresponding connections with the lead frames may be modified over time. A mold cavity may have been optimally designed to avoid the formation of voids in an initial lead frame configuration of a package for a certain semiconductor die or die stack. However, when the semiconductor die is modified such that the size or shape of the die has changed (for example, when die "shrinks" are implemented from one generation of a die to the next, to increase yield per wafer), then voids may form in the encapsulant due to a change in the flow pattern thereof during transfer molding. As retooling the mold plates may cost well in excess of one hundred thousand dollars, it would be desirable to be able to beneficially modify the flow characteristics of resin within a mold cavity without having to modify the mold cavity itself. Several attempts to solve this problem by modifying a lead frame characteristic have been made.

One attempt to control the flow of resin in a mold cavity has been to kink, cut, or bend a tie bar adjacent to a gate of the mold cavity. Another approach has been to form an offset in a lead frame, such as in a tie bar, close to a gate to affect the flow of resin entering the mold cavity. Both approaches are limited to controlling the amount of resin that flows across the top or bottom surface of a lead frame. Additionally, both approaches are limited to being located near a gate of a mold cavity.

A third approach has been to include an additional hole in a lead frame to allow resin to flow into a top portion of a mold cavity before flowing into a bottom portion. However, this approach is unable to modify a flow of resin within the cavity once the resin has left the gate area of the mold cavity.

A fourth approach has been to extend a region of a lead finger of a lead frame, where the extended region is in the same plane as the lead finger and the remainder of the lead frame. The extended region is close to the gate of the mold cavity and purportedly results in a more even distribution of resin across the top and bottom of the lead frame. This approach, again, requires that the extended region must be close to the gate of the mold cavity.

A fifth approach has been to modify the flow of resin on a lead finger-by-lead finger basis. In this approach, the ends of the lead finger may be down-set similar to the down-set of the paddle of a lead frame. A lead finger may then be wire-bonded to the semiconductor die. The resulting vertically oriented portion of the lead finger purportedly reduces the flow rate of resin right at the bonding point of a wire to the end of the lead finger. The fifth approach also involves forming a second wire ball to cover the heel of the wire bond connecting a lead finger and a semiconductor die. A second wire is attached to the second wire ball and to the lead finger. The second wire and the second ball serve to retard the flow of resin at the lead finger wire bonding point. The fifth approach is generally not viable for solving the problem of voids, pinholes, and knit lines in a package.

A sixth approach includes the use of a flow diverter positioned adjacent a flow hole in a lead frame. The flow diverter is positioned to increase the volume of material that passes through the flow hole and underneath the lead frame.

A need exists in the art for a lead frame that may be modified in a wide variety of locations to restrict and redirect the flow of resin within a mold cavity. A further need exists to control the flow rate of resin around the sides of a semiconductor die stack.

Heretofore, the packaging of semiconductor dice has been discussed in the context of lead frame-mounted dice. However, some semiconductor dice or chips are packaged after mounting the chip onto a substrate, such as a printed circuit board (PCB). For example, with so-called "flip-chips," the active surface of the semiconductor die bears solder balls or other discrete conductive elements protruding therefrom, which serve to mechanically and electrically connect the semiconductor die to a supporting substrate. A flip-chip may be underfilled with a flowable dielectric material to surround the space between and around the discrete conductive elements. The flip-chip may then be wholly or partially encapsulated in a packaging resin, or the encapsulation performed concurrently with the underfill.

Additionally, semiconductor dice may be mounted directly to substrates other than lead frames, such as to interposer substrates in a chip-on-board (COB) or board-on-chip (BOC) structure, which may be configured as, for example, ball grid array (BGA), pin grid array (PGA) or land grid array (LGA) packages. For example, a number of semiconductor dice may be mounted to an array of unsingulated interposer substrates disposed within a mold cavity, and then resin flowed over the surface of the interposer substrates to encapsulate the dice and conductive elements, such as wire bonds, electrically connecting the semiconductor dice to the interposer substrates. Once the resin is cured, the individual encapsulated semiconductor dice mounted to their respective interposer substrates may be separated, or "singulated," from each other.

Generally, whenever a molding compound such as a thermoplastic resin or other flowable dielectric material is forced to flow over or around a lead frame or other substrate with one or more semiconductor dice mounted thereto within a mold cavity, the resin may flow faster around the sides of the dice than over and under the dice. This may result in voids forming over the tops and bottoms of some of the semiconductor dice, particularly the semiconductor dice in a mold cavity farthest from the resin entry point. A need exists in the art to reduce the flow of resin in between the dice to avoid the formation of voids and other defects in the packaging encapsulant.

BRIEF DESCRIPTION OF THE SEVERAL VIEWS OF THE DRAWINGS

A more particular description of the invention briefly described above will be rendered by reference to specific embodiments thereof, which are illustrated in the appended drawings. Understanding that these drawings depict only embodiments of the invention and are not therefore to be considered limiting of its scope, the invention will be described and explained with additional specificity and detail through the use of the accompanying drawings in which.

DETAILED DESCRIPTION OF THE INVENTION

Figure 1:
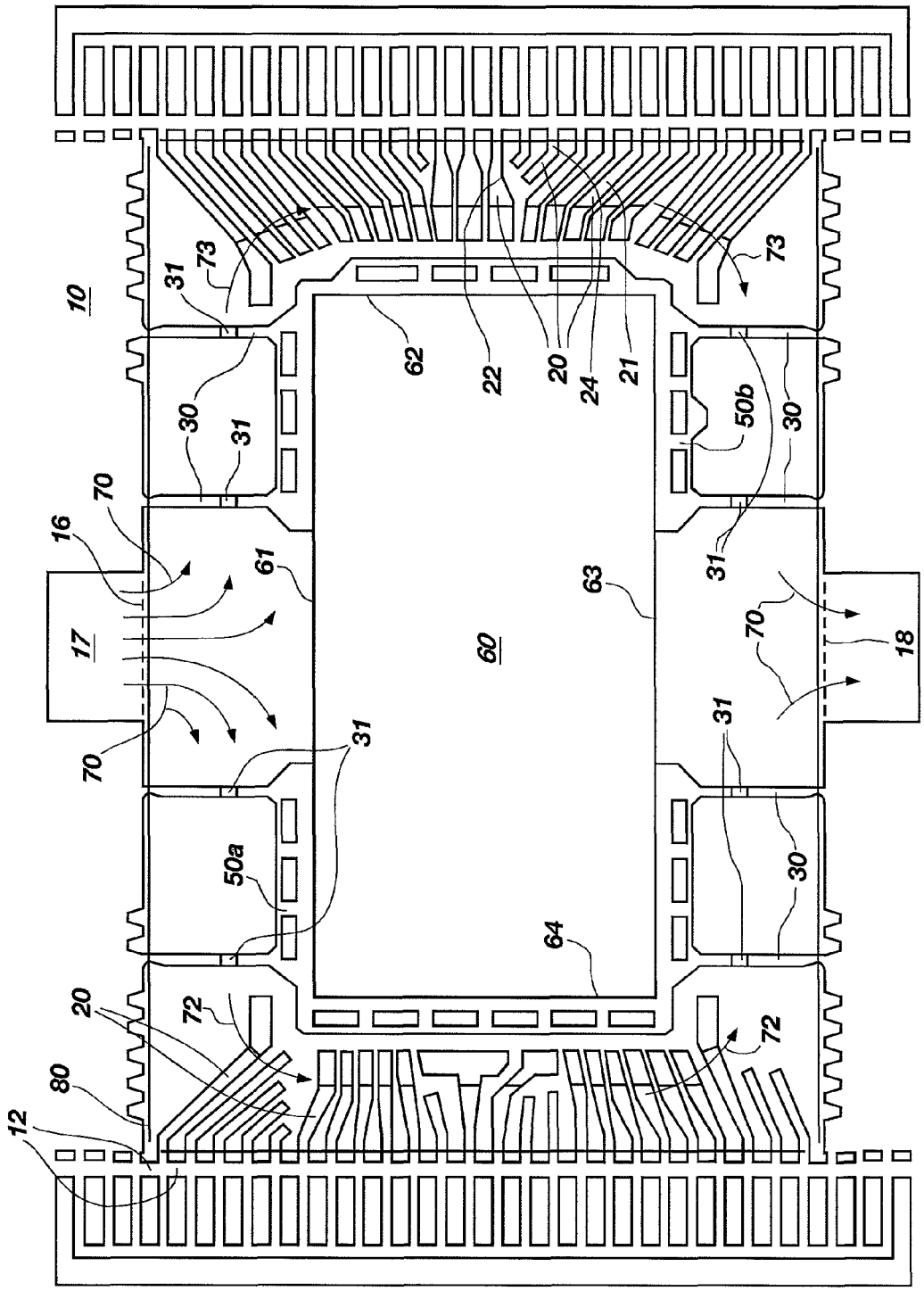
FIG. 1 illustrates a conventional paddle-die set without the benefit of embodiments of the present invention.

Embodiments of the present invention may be utilized with lead frames, interposer substrates, circuit boards, or in any other application where a flowable packaging material tends to flow around the sides of a semiconductor die or dice rather than over and/or under the die or dice during an encapsulation operation conducted using a mold cavity or group of mold cavities. Embodiments of the present invention may be employed to modify the hydraulic characteristics of flowable packaging material confined by a mold cavity as it passes therethrough to encapsulate a semiconductor device assembly placed therein.

In accordance with one embodiment of the present invention, as broadly described herein, the present invention may comprise a lead frame for packaging a semiconductor die or dice. The lead frame comprises at least one support member adapted for connection to the die, the at least one support member including an enlarged portion adjacent a perimeter of the support member and outside of the footprint of the die mounted thereto, the enlarged portion having at least a portion thereof configured for selective orientation in a non-parallel orientation to a plane of the support member or in some other, substantially non-parallel orientation to an intended direction of flow of molding compound during encapsulation of the die or dice. The at least a portion of the enlarged portion may be so selectively oriented during fabrication of the lead frame, or thereafter, to provide a barrier effective to impede flow of molding compound. Such lead frames in strip form also comprise embodiments of the invention.

In accordance with another embodiment of the present invention, the present invention may comprise a lead frame for packaging a semiconductor die or dice. In this embodiment, the lead frame may comprise a member other than a support member such as, without limitation, a lead finger or a tie bar, comprising an enlarged portion having at least a portion thereof configured for selective orientation in a non-parallel orientation to a major plane of the lead frame or in some other, substantially non-parallel orientation to an intended direction of flow of molding compound during encapsulation of the die or dice. The at least a portion of the enlarged portion may be so selectively oriented during fabrication of the lead frame, or thereafter, to provide a barrier effective to impede flow of molding compound. Such lead frames in strip form also comprise embodiments of the invention.

Another embodiment of the present invention comprises a method of packaging a semiconductor die or dice, the method comprising flowing a molding compound over and around a semiconductor die or dice while selectively impeding the flow of a portion of the molding compound around the sides of the semiconductor die or die stack to cause enhanced flow of another portion of the molding compound across at least one of a top surface and a bottom surface of the semiconductor die or dice.

A further embodiment of the present invention comprises a molding compound flow diverting device for use in encapsulation of semiconductor dice carried on a substrate other than a lead frame, the device comprising a grid structure including a plurality of interconnected baffles and optionally, a plurality of support members. The grid structure may be adapted to engage the substrate, to be engaged by the mold plates, or both.

In each of the embodiments of the invention, the flow rates of molding compound past various sides of a semiconductor device assembly may be equalized or otherwise modified to preclude a shortage of molding compound in a given area of a mold cavity. Similarly, when molding compound is being flowed past a number of semiconductor dice or semiconductor device assemblies in serial fashion, embodiments of the present invention may be selectively placed and oriented to provide substantially uniform coverage by the molding compound within a mold cavity or a group of mold cavities.

Semiconductor device assemblies fabricated in accordance with embodiments of the invention are also encompassed thereby.

These and other features and advantages of the present invention will become more fully apparent from the following description and appended claims, or may be learned by the practice of the invention as set forth hereinafter.

In the drawing figures, like numbers describe like elements. Whenever similar elements are alphabetically differentiated, such as "$100a$," "$100b$," "$100c$," etc., and reference is made without a letter, such as "$100$," then the broad class of the element, which includes all of the alphabetically differentiated variations, is referenced. The terms "resin" and "molding compound," as the term is used herein, encompasses any flowable molding or encapsulation compound, whether or not characterized in the chemical sense as a resin per se, as well as other flowable packaging materials known in the art.

FIG. 1 illustrates a conventional lead frame without the benefit of embodiments of the present invention. A semiconductor die 60 (or stack of dice 60) is mounted on the two paddles 50a and 50b of a lead frame 10, which are supported from the periphery of the lead frame strip by ties bars 30, as is conventional. Of course, lead frames with single paddles, quad paddles or other paddle variations may experience similar deficiencies in encapsulant integrity. Lead frame 10 includes a plurality of lead fingers 20 adjacent the peripheries of paddles 50a and 50b, lead fingers 20 being laterally joined by dam bars 12, as is conventional. As shown, paddles 50a and 50b have been downset at 31 with respect to lead fingers 20, as is conventional. Lead frame 10 may be placed in a mold cavity defined between two segments or plates of a mold, where the mold cavity defines the exterior surface of package 80. Resin 70 may be injected through runner 17 and gate 16 into the mold cavity (periphery not shown) in which lead frame 10, bearing semiconductor die or dice 60, is disposed. It is desirable for resin 70 to fill the entire mold cavity volume between the semiconductor die assembly and the inner wall of the mold cavity without forming knit lines, pin holes, or voids. FIG. 1 illustrates where resin 70, after contacting front surface 61 of semiconductor die or dice 60, follows flow path 72 and 73 around the side 62 and side 64 of semiconductor die or dice 60 and past rear surface 63 thereof. Resin 70 then exits out vent 18 without a sufficient portion thereof flowing over the top of semiconductor die 60 or underneath paddles 50a and 50b, resulting in unacceptable voids in the resin 70 in those areas, compromising packaging integrity.

Figure 2:
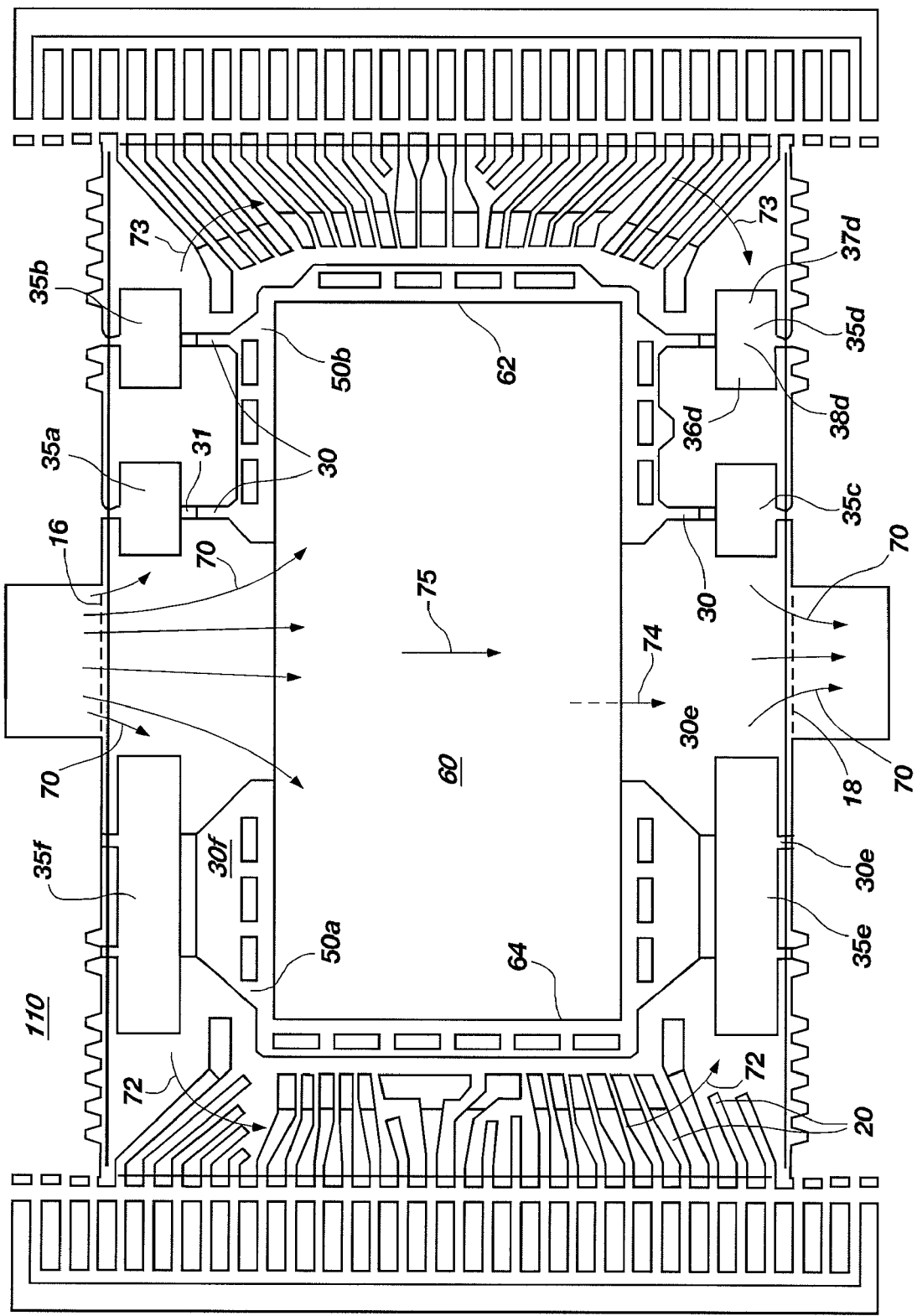
FIG. 2 illustrates an embodiment of the invention where the tie bars of the paddle-die set of FIG. 1 have been modified to include baffles.

In FIG. 2, lead frame 110 has been modified with embodiments of the present invention, which are adaptable to virtually any lead frame configuration. It will be appreciated by one of ordinary skill in the art that one, some, or all of the embodiments of lead frame modification, as depicted in FIG. 2, may be employed with a lead frame of any given configuration. Tie bars 30 have been modified to include baffles 35a through 35f. In FIG. 2 as in FIG. 1, paddles 50a and 50b have been down-set as shown by down-set marks 31 of the tie bars 30. Baffles 35a through 35f, as shown in FIG. 2, have not yet been angled or rotated out of a plane substantially parallel to the lead frame 110 (and, thus, to the direction of resin flow) in accordance with embodiments of the present invention. The angling of the baffles 35a through 35f may occur at any time, such as before, during, or after the down-set of the paddles 50a and 50b. The same down-set tool may be used to angle baffles 35a through 35f. Any other conventional tool or device as known in the art for bending lead frames may be used. Alternatively, baffles 35a through 35f may be formed in an angled position during initial fabrication of lead frame 110. Baffles 35a through 35d are all similar and the elements of baffle 35d are also present in baffles 35a, 35b, and 35c. For reference purposes, it should be noted that baffle 35d, as an example of baffles 35*a* through 35*f*, includes a first baffle element 36*d*, support member 38*d*, and a second baffle element 37*d*, the other baffles including like elements, similarly numbered. Baffles 35 thus may be selectively placed, sized and oriented to impede flow of resin 70 through areas of larger cross-section, for example along the sides of a semiconductor die or plurality of dice so that more resin 70 flows across, again by way of example only, a top or bottom surface of the semiconductor die or group of dice. Stated another way, the flow rate of resin 70 may be modified in selected areas so that the overall resin flow front is maintained at a more constant rate, rather than one portion thereof moving substantially ahead of another portion, resulting in voids and other defects in the encapsulant package being formed.

Figure 7A:
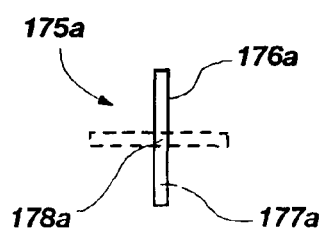
FIGS. 7A through 7D illustrate embodiments of a baffle.
Figure 7B:
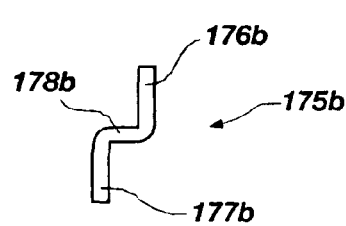
Figure 7C:
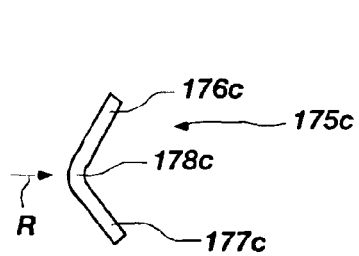
Figure 7D:
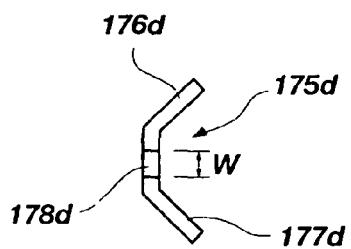

FIGS. 7A through 7D illustrate a few embodiments of how baffles 35*a* through 35*d* may be configured prior to the transfer molding process. FIGS. 7A through 7D refer generically to baffles such as, but not limited to, those of FIG. 2. In FIG. 7A, a baffle 175*a* has been twisted so that the baffle 175*a* is no longer in a horizontal plane parallel to resin flow, but is more vertical, substantially transverse to resin flow. In this particular embodiment, first baffle element 176*a* is in line with support member 178*a* and second baffle element 177*a*, such that baffle 175*a* essentially presents a flat surface. Baffle 175*a* may be inclined at any angle and does not have to be perpendicular (i.e., vertical), the angle of inclination being selected for the relative degree of resin flow impedance desired. FIG. 7B illustrates another embodiment of baffle 175*b* where first baffle element 176*b* and second baffle element 177*b* are in parallel planes, but support member 178*b* remains in a horizontal plane, creating a step-like configuration. FIG. 7C illustrates an embodiment where baffle 175*c* is configured in a "V" or chevron, shape and support member 178*c* is reoriented transverse to resin flow. In a particular embodiment, as illustrated in FIG. 7D, support member 178*d* may be the same width "w" as the remainder of a tie bar 30 (FIG. 2). FIG. 7D illustrates an embodiment of baffle 175*d* where first baffle element 176*d* and second baffle element 177*d* are bent at a location other than the edge of support member 178*d*, support member 178*d* being reoriented transverse to resin flow.

First baffle elements 176 and second baffle elements 177 may include any desired number of steps and bends. In FIGS. 7A through 7D, the first baffle elements 176 and second baffle elements 177 are all shown as having flat surfaces. However, first baffle elements 176 and second baffle elements 177 may also be shaped with arcuate portions. FIGS. 7A through 7D illustrate a few embodiments of how a baffle may be modified or formed. Baffles 175 may be formed by etching or stamping as used conventionally in lead frame fabrication, and then cut, twisted, bent, or modified to function in accordance with embodiments of the present invention.

Referring once again to FIG. 2, tie bars 30*e* and 30*f* illustrate that tie bars 30 may be modified to provide increased structural support to baffles 35*e* and 35*f*, respectively. A tie bar 30 may be modified in any manner desirable to support baffles 35. Baffles 35*e* and 35*f* are shown prior to any reconfiguration of one or more portions of the baffles out of a horizontal or other plane substantially parallel to molding compound flow. The discussion regarding the baffle embodiments and configuring thereof, as shown in FIGS. 7A through 7D, apply equally to baffles 35*e* and 35*f*. Baffles 35*a* through 35*f* illustrate only two embodiments of the present invention. A tie bar 30 may be modified to include an enlarged, baffle portion in any manner. Likewise, the enlarged, baffle portion may be bent, twisted, or otherwise modified in any manner suitable to restrict the flow of resin 70 and desirably redirect the flow of resin 70. In particular, a tie bar 30 may be modified in any manner such that resin 70, in addition to flowing along flow paths 72 and 73, also flows along flow path 75 across a top surface of semiconductor die 60 and along flow path 74 underneath semiconductor die 60 and paddles 50*a* and 50*b*. Additionally, a tie bar 30 may be modified in conjunction with the modification of a paddle 50 to create an appropriate baffle.

It should be noted with reference to FIG. 2 that lead fingers 20, and any corresponding bond wires (not shown) extending between lead fingers 20 and semiconductor die or dice 60, may be orientated substantially transverse to a flow path 72, 73 of resin 70.

Figure 3:
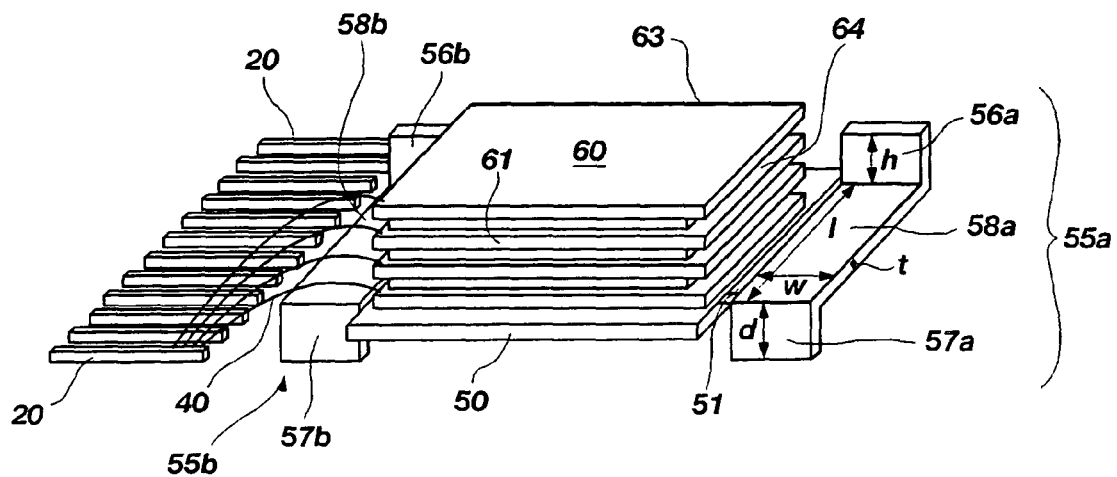
FIG. 3 illustrates an embodiment of the present invention where a paddle has been modified to include one or more baffles.

FIG. 3 illustrates a particular embodiment of the invention, wherein a die paddle 50 may be modified to incorporate baffles 55*a* and 55*b*. Baffles 55*a* and 55*b* may be made from existing material of die paddle 50 or die paddle 50 may be elongated or otherwise enlarged for the purpose of providing baffles 55*a* and 55*b*. Baffle 55*a* includes first baffle element 56*a*, support member 58*a*, and second baffle element 57*a*. Baffle 55*b*, as shown, includes first baffle element 56*b*, support member 58*b*, and second baffle element 57*b*. Baffle 55*a* and baffle 55*b* may be similar or different, although in symmetrical packages they may generally be identical in structure and configuration. Alternatively, only a single baffle 55*a* or 55*b* may be used, in some package configurations. Baffles 55*a* and 55*b* may be of any suitable width. Lead fingers 20 are shown adjacent baffle 55*b*. Lead fingers 20 may also lie adjacent baffle 55*a*, as well as adjacent the other sides of paddle 50, such as in a quad flat package (QFP) configuration. In FIG. 3, the height of first baffle element 56*a* is less than the height of the stack of semiconductor dice 60; however, the height of first baffle element 56*a* is not limited. In a particular embodiment, the height "h" of upper baffle 56*a* is governed by the length "l" of support member 58*a*, which may be upset out of a horizontal or other plane substantially parallel to molding compound flow. However, in other embodiments, the height "h" of upper baffle 56*a* is not determined by or is not affected by the length "l". Similarly, the width of first baffle element 56*a* may be the same as the width "w" of support member 58*a* or they may be different. The same variations may apply with respect to lower baffle 57*a*.

In a particular embodiment, the thickness "t" of baffle 55*a* is the same as the thickness of paddle 50. In other embodiments, the thickness of baffle 55*a* may be greater or less than that of paddle 50. For example, baffle 55*a* may be laminated with a support layer to increase the rigidity of baffle 55*a*. Baffle 55*a* may also include support ridges transverse to the major plane thereof to increase the rigidity. Second baffle element 57*a* and first baffle element 56*a* may be horizontally separated from paddle 50 by a lateral gap 51, as shown. Gap 51 may be as narrow or as wide as desired to promote resin flow adjacent to the stack of semiconductor dice 60. Baffle 55*a* may be as wide as desirable to provide the necessary adjustment to the flow rate of resin flowing around the side of semiconductor die 60. As the width "w" of baffle 55*a* increases, the length of the bond wires 40 connecting semiconductor die 60 to lead fingers 20 must increase. However, process parameters may be modified to avoid wire sweep with the longer bond wires and sweep is not perceived to be a significant problem.

First baffle element 56*a* and second baffle element 57*a* may be bent or twisted by a down-set tool during the packaging process. Alternatively, first baffle element 56*a* and second baffle element 57*a* may be formed perpendicular or at some other angle to support member 58*a* at the time the lead frame is formed. Even though the height of upper baffle 56*a* is not a limiting factor, it will generally be undesirable for first baffle element 56*a* or second baffle element 57*a* to contact a mold cavity wall, unless it is desirable to employ same to stabilize the lead frame in the mold cavity.

The discussion regarding baffle 55a may apply equally to baffle 55b. Four semiconductor dice 60 are illustrated in FIG. 3, to form a quad die package (QDP). Only a single semiconductor die 60 may be employed in a package, or some other number of semiconductor dice 60.

Referring to FIG. 3, as resin (not shown) flows against front surfaces 61 and around sides 64 of semiconductor dice 60, first baffle elements 56a and 56b and second baffle elements 57a and 57b impede the resin flow and reduce the resin flow rate around the sides 64 of semiconductor dice 60. These restrictions placed adjacent the sides of semiconductor dice 60 tend to induce a flow of resin over the top of uppermost semiconductor dice 60 and underneath paddle 50. Baffles 55a and 55b may be located on any suitable side or sides of semiconductor die 60 in positions that do not interfere with wire bonding to lead fingers 20. In a particular embodiment, baffles 55 may be placed adjacent all four sides of semiconductor dice 60.

First baffle element 56a is shown perpendicular to support member 58a as is second baffle element 57a; however, first baffle element 56a may be inclined at any suitable angle relative to support member 58a. In a particular embodiment, first baffle element 56a is disposed at a 110 degree included angle relative to support member 58a and second baffle element 57a may be inclined to the same orientation.

Figure 4:
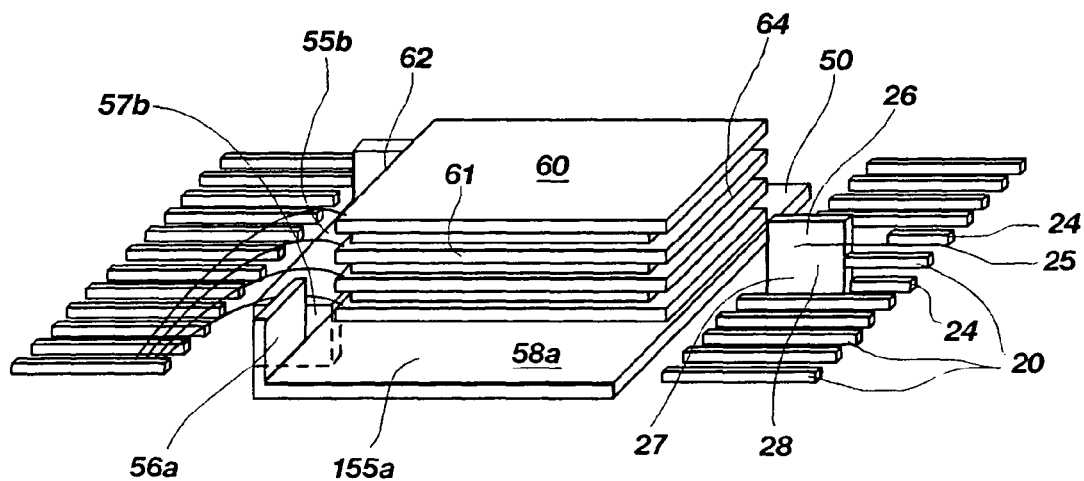
FIG. 4 illustrates embodiments of the present invention where both a paddle and a lead finger have each been modified with a baffle.

FIG. 4 illustrates an embodiment where a baffle 155a extends in front of front surfaces 61 of semiconductor dice 60 while baffle 55b is located on the side, as in FIG. 3. In FIG. 4, baffle 155a only includes a first baffle element 56a. FIG. 4 further illustrates that multiple baffles 55 and 155 may be present, but do not need to be symmetrical or symmetrically placed. For example, where a resin 70 (not shown) exhibits a greater flow rate around side 62 of semiconductor die 60 than it does around side 64, then a baffle 55b may only be necessary around the side 62 of semiconductor die 60. Paddle 50 may be enlarged and modified in any manner necessary or desirable to provide baffles to restrict the flow rate of a resin 70. The configurations of baffles 175 of FIGS. 7A through 7D apply equally to baffles 55 and 155. In addition to modifying the tie bars 30 or paddles 50 to provide a flow restriction device, a lead finger 20 may also be modified, as shown.

As shown in FIG. 1, an individual lead finger 20 may be a hot lead 21, a ground lead 22, or a dummy lead 24. A portion of the length or all of the length of a lead finger 20 may be enlarged to serve as a baffle for restricting the flow of resin 70. This enlarged portion may be twisted during the packaging process to serve as a baffle or may be formed in position at the time the lead frame is formed. FIG. 4 illustrates an embodiment where a lead finger 20 has been modified to include a baffle 25, and adjacent foreshortened dummy leads truncated to accommodate the lateral extend of baffle 25 before reorientation thereof. Baffle 25 includes first baffle element 26, a second baffle element 27, and a support member 28, which may extend contiguously with the remainder of lead finger 20 from one side of baffle 25 to the other. FIG. 4 illustrates a single baffle 25 along the length of lead finger 20; however, any number of baffles 25 may be placed along the length of lead finger 20. Additionally, multiple lead fingers 20 may be modified to include a baffle 25. A selected lead finger 20 may be modified in width, thickness, or material composition in any manner necessary to provide desirable structural support for the chosen dimension of baffle 25. The previous discussion regarding the numerous modifications to a baffle, such as baffle 175 of FIGS. 7A through 7D, applies to baffles 25 as well. In addition to a lead finger 20 being modified with a baffle 25 to serve as a flow restriction device, the lead finger 20 may also serve conventional, conductive functions. For example, the baffle 25 shown in FIG. 4 may, because of its vertical orientation, facilitate wire bonding to multiple levels of semiconductor die 60. In one embodiment, additional dam bars may be placed along the length of a modified lead finger 20 to laterally connect the lead finger 20 with adjacent dummy leads 24 to provide additional structural support.

Figure 5:
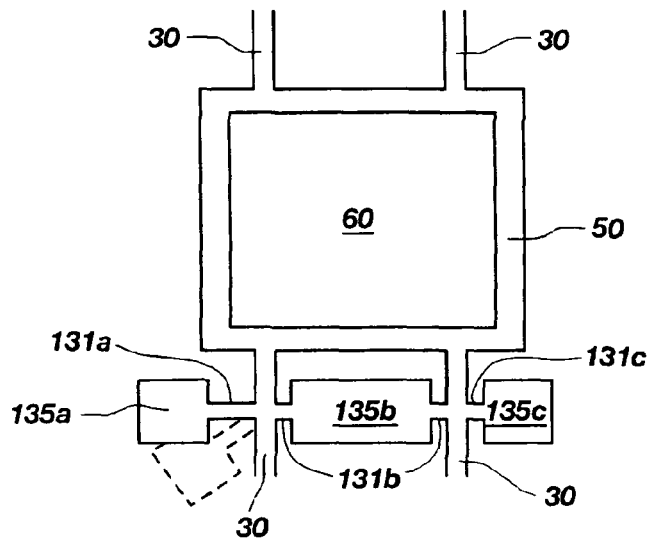
FIG. 5 illustrates an embodiment of baffle attachment to a paddle-die set.

FIG. 5 illustrates that a baffle may be extended indirectly from support or conductive members of a lead frame. In a particular embodiment, baffles 135a, 135b, and 135c may extend from tie bars 30. Baffle 135a may be connected by neck 131a to tie bar 30. Neck 131a may be any length necessary. Baffle 135a may be connected to tie bar 30 by a single neck 131a or multiple necks 131a. Neck 131a may be bent, twisted, or manipulated in any manner desired along X, Y and Z axes. For example, neck 131a may be initially perpendicular to tie bar 30, but then later bent to a position such as that shown in phantom in FIG. 5. Neck 131a may also be angled vertically to any desired degree, as well as twisted about its longitudinal extent. Baffle 135a may include a first baffle portion and a second baffle portion, as in previously described embodiments, or baffle 135a may serve solely as an upwardly or downwardly extending baffle. Baffle 135c is shown suspended from a tie bar 30 through neck 131c. Baffle 153b is suspending from two tie bars 30 by necks 131b, and may be twisted thereabout as well as bent in a symmetrical or asymmetrical manner to deflect resin flow. Baffles 135a, 135b, and 135c may, instead of extending from tie bars 30, extend directly or indirectly from paddles 50 or lead fingers 20.

A baffle may be added to a support or conductive member of a lead frame by either modifying the structure of such support and/or conductive members or by extending baffles indirectly off of the support or conductive members.

Figure 6A:
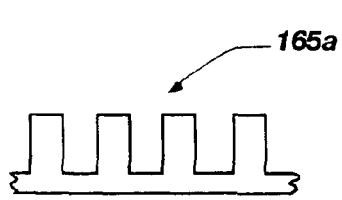
FIGS. 6A through 6D illustrate embodiments of a baffle.
Figure 6B:
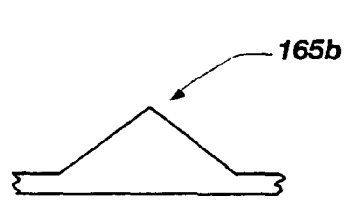
Figure 6C:
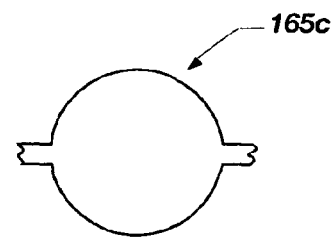
Figure 6D:
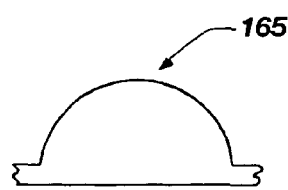

Heretofore, the baffle embodiments have been described as rectangular structures. However, the baffles may be trapezoidal, circular, triangular, or any other shape. FIGS. 6A through 6D illustrate various embodiments of non-rectangular baffles. FIG. 6A illustrates an embodiment where a baffle 165a extends as a series of laterally spaced, comb-like fingers from the edge of a support or conductive member. FIG. 6B depicts a baffle 165b having a triangular configuration. FIG. 6C depicts a baffle 165c having a circular configuration. FIG. 6D depicts a baffle 165d having a semicircular configuration. "Support or conductive member," as the phrase is used herein, encompasses paddles 50, tie bars 30, lead fingers 20, or any other portion of a lead frame that lies in proximity to one or more semiconductor dice 60.

Any type of packaging technology that utilizes lead frames may use the embodiments of the present invention. The baffle embodiments may be used to direct flow across the top surface of a semiconductor die 60 and additionally across the bottom surface of the paddle 50. In some situations, flowing resin 70 under paddle 50 would be undesirable such as when the paddle 50 will be exposed to serve as a heat sink and/or electrical ground. In such situations, the baffle embodiments may still be utilized to direct resin flow to avoid flow under a paddle 50.

Figure 11:
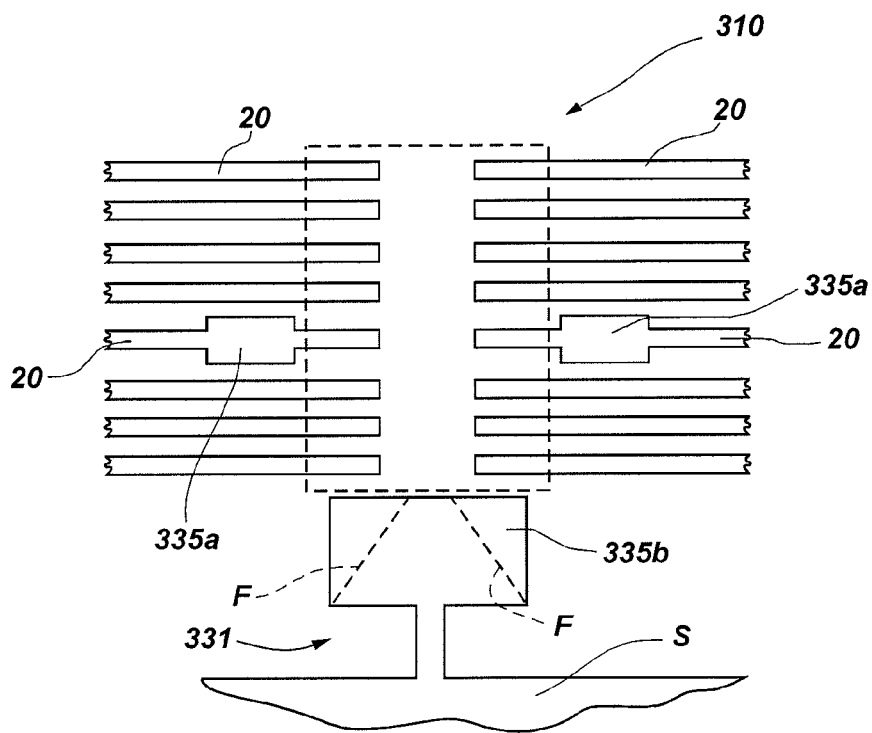
FIG. 11 illustrates an embodiment of the present invention in the context of a leads-over-chip semiconductor device assembly.

In an embodiment depicted in FIG. 11, a leads-over-chip (LOC) lead frame 310 having lead fingers 20 extending over an active surface of a semiconductor die 60, as shown in broken lines, may be provided with baffles 335a on lead fingers 20, as well as baffles 335b on one or more projections 331 from the surrounding lead frame strip, S, as shown. In this embodiment, baffles 335b may be deflected along a diagonal fold line F, as shown, to impede and redirect resin flow.

Baffles 335*a* may be twisted about the longitudinal axes of their respective lead fingers 20.

In a particular embodiment, flow-diverting structures may also be utilized to provide an increasing restriction as the flow rate of resin 70 increases. For example, the degree to which a baffle intersects the flow of resin 70 may be determined by the flow rate of resin 70. For example, baffle 175*c* shown in FIG. 7C may be used for this purpose. In a particular embodiment, upper baffle 176*c* and lower baffle 177*c* may be bent close together forming a partially opened clam shell. Baffle 175*c* may be made of a flexible or resilient spring-like material such that the angle of upper baffle 176*c*, with respect to lower baffle 177*c*, is determined by the pressure exerted by the flow of resin 70. The greater degree to which first baffle 176*c* and second baffle 177*c* are opened or deflected, the greater the quantity of resin 70 restricted by the baffle 175*c*. Therefore, if resin 70 is flowing relatively slowly in the direction indicated by arrow R, then baffle 175*c* will remain open or undeflected and will present a substantial restriction to the flow; however, if resin 70 is flowing relatively quickly, then baffle 175*c* will collapse to a greater degree and provide a lesser restriction to the flow of the resin 70. On the other hand, if resin 70 is flowing in the opposite direction (or the orientation of baffle 175*c* in the drawing figure reversed), a greater resin flow rate would result in a greater restriction as baffles 176*c* and 177*c* would be deflected and spread toward a more vertical position, transverse to resin flow. Baffle 175*c* is just one embodiment of a baffle that may increase the restriction of resin 70 proportional to the flow rate. The configuration of baffle 175*c* may be used with a baffle 25, baffle 35, baffle 55, baffle 155, baffle 165, baffle 175, baffle 335, or others.

A variety of factors influence the flow rate of resin flowing in a particular paddle-die set mold cavity. For example, a molding machine may conventionally have a separate injection channel that mates with each runner 17 of a paddle-die set. Non-uniformities in the molding machine injection channels may result in individual mold cavities receiving different flow rates. Where the injection channel of a molding machine feeds multiple mold cavities in series, the flow rate experienced by a first paddle-die set is going to be much higher than a flow rate experienced by a later paddle-die set at the end of the series. A number of other factors may also affect the flow rate and the flow patterns at the different paddle-die set mold cavities.

In practicing an embodiment of the invention, a worker may intentionally short-shot the flow of resin 70 to a number of lead frames in strip form disposed in a mold to determine the relative flow rates at different paddle-die set mold cavities of a lead frame strip. The worker may also be able to determine the locations in a mold cavity where the flow rate is differing or voiding. "Short-shotting," as the term is used herein, refers to any process where the packaging of paddle-die sets is prematurely stopped. This may be accomplished by providing less than sufficient resin to encapsulate all of the paddle-die sets of the lead frame strip, or any other way known in the art.

In a particular embodiment, a baffle, such as baffle 35, baffle 55, baffle 155, baffle 165, baffle 165, baffle 175, or baffle 335 may be attached to a support or conductive member and arranged substantially transverse to a flow path of resin 70. The upper baffle and lower baffle of a baffle, such as baffle 35, baffle 55, baffle 155, baffle 165, baffle 175, or baffle 335 may have any angular orientation relative to a major plane of a semiconductor die 60 or the direction of molding compound flow. In a particular embodiment, the upwardly and downwardly extending portions may have any non-parallel orientation relative to a bottom surface of semiconductor die 60 or the direction of molding compound flow.

Once at least one lead frame strip has been short-shotted, then a worker may selectively modify one or more lead frames thereof to include flow-diverting structures in the appropriate paddle-die sets of the lead frame strip. For example, where a lead frame strip has eight paddle-die sets, it may be that only five of those sets actually need modification of the resin flow inside those cavities. Of those five paddle-die sets, each set may need to be modified in a unique way, or in a similar manner. The newly modified lead frame strip may then be placed in the molding machine and then once again resin may be intentionally short-shotted into the lead frame strip. Therefore, a worker may be able to iteratively modify lead frames of a lead frame strip and then intentionally short-shot until the appropriate resin flow characteristics within each of the paddle-die set cavities is achieved. At that point, the lead frame strip may be mass-produced in modified form.

Additionally, modeling software may be utilized to predict where shorting of resin flow may occur within the different paddle-die sets of a lead frame strip. C-Mold is a non-limiting example of modeling software that may be utilized to determine where in the paddle-die sets of a lead frame strip resin shorting will occur.

In other embodiments, the present invention may also be used for die packaging that does not include lead frames. A few non-limiting examples are flip-chip, BGA, PGA, chip-on-board (COB), and board-on-chip (BOC) packages. A few examples of BGA packages and variations thereof include plastic BGA, enhanced plastic BGA, tape BGA, ceramic BGA, column ceramic BGA (also known as column grid arrays), flip-chip BGA, fine-pitch land grid array, and fine-pitch BGA (also referred to as chip scale packages). The embodiments of the present invention apply to any type of semiconductor die packaging involving flowing resin to encapsulate at least a portion of a semiconductor die.

Figure 8A:
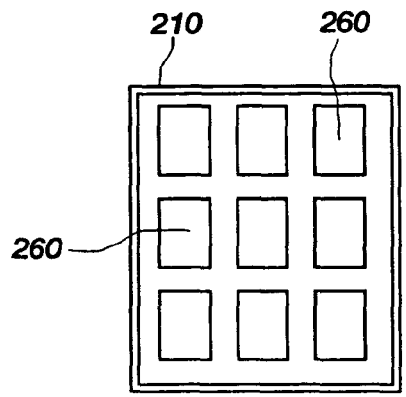
FIG. 8A illustrates an array of semiconductor dice placed on a substrate.

FIGS. 8A through 8D illustrate an application to which an embodiment of the present invention may apply. In FIG. 8A, a plurality of semiconductor dice 260 have been attached to a substrate 210. Semiconductor dice 260 may be attached to substrate 210 by any means known in the art, such as by a liquid adhesive, an adhesive-coated tape, by discrete conductive elements such as balls, bumps, studs, pillars, columns or pins also serving as electrical connections, etc. Substrate 210 may be a printed circuit board, a ceramic substrate, an array of unsingulated interposer substrates, a wafer or other bulk semiconductor substrate, or any other substrate.

Figure 8B:
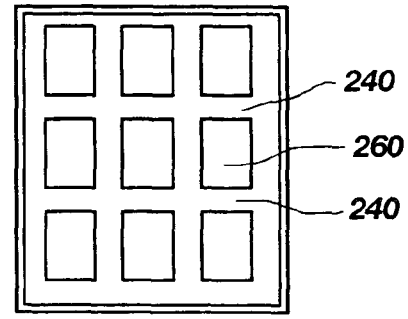
FIG. 8B illustrates the wire bonding of the semiconductor die of FIG. 8A to the substrate.
Figure 8C:
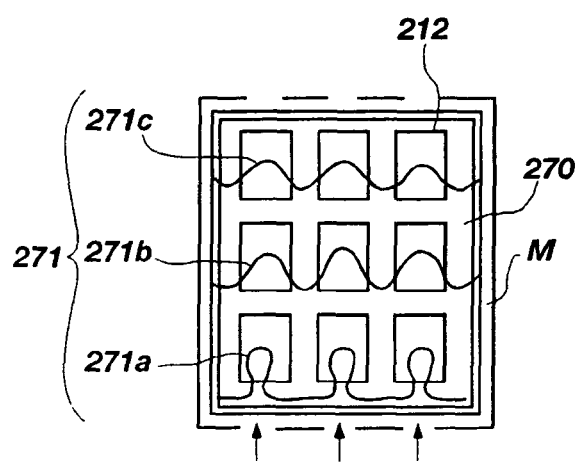
FIG. 8C illustrates flow fronts of resin flow across the substrate of FIG. 8B during encapsulation of the semiconductor dice.

Semiconductor dice 260 may then be electrically connected (if not already connected as noted above) to substrate 210, such as by wire bonds 240, as shown in FIG. 8B. FIG. 8B illustrates wire bonds 240 across the top and bottom edges of semiconductor dice 260 (as the drawing figure is oriented); however, wire bonds 240 may be placed around any edge of semiconductor type die 260. As noted above, instead of wire bonds 240, discrete conductive elements may be used, such as in a flip-chip package. In FIG. 8C, the assembly of semiconductor dice 260 and substrate 210 has been placed in a mold M and clamped at an edge 212 between two mating segments of the mold M. FIG. 8C also illustrates that resin 270 may be flowed into the mold cavity as indicated by the arrows and across the surface of substrate 210 from one edge to the other. Resin 270 may be used to underfill or encapsulate semiconductor dice 260.

As shown in FIG. 8C, as resin 270 flows onto substrate 210, flow front 271 having a configuration varying between 271*a*, 271*b* and 271*c* as it progresses across substrate 210 as shown is established. Resin 270 tends to flow rapidly in the open areas between semiconductor dice 260 and flow relatively slowly over the tops of semiconductor dice 260. This may result in voids, knit lines, or pinholes forming over the top of semiconductor dice 260. The "top" of semiconductor dice 260 is relative to substrate 210 and not necessarily indicative of the orientation of semiconductor dice 260. For example, when semiconductor dice 260 are configured as flip-chips, the "top" is the non-active face of the flip-chip wafers. A faster flow rate of resin 270 between semiconductor dice 260 may also result in voids between solder balls or other discrete conductive elements in the standoff between semiconductor dice 260 and substrate 210 in flip-chip applications.

Substrate 210 may be conventionally placed in a mold (not shown) for the purpose of flowing resin 270 over the substrate 210. In a particular embodiment of the invention depicted in FIG. 8D, an insert 230 is placed inside of the mold M and attached to a surface of substrate 210 on which semiconductor dice 260 are mounted. Insert 230 may include a plurality of baffles 235, shown in FIG. 8D as being arranged in a grid pattern. Baffles 235 may be configured to reduce the flow rate of resin 270 in between the semiconductor dice 260 to a flow rate comparable to the flow rate of resin 270 over the tops of semiconductor dice 260. Flow front 271 as depicted at 271$d$, 271$e$, and 271$f$ as the resin progresses across substrate 210 illustrate how flow front 271 as depicted at 271$a$, 271$b$, and 271$c$ may be modified by the use of insert 230.

Figure 8D:
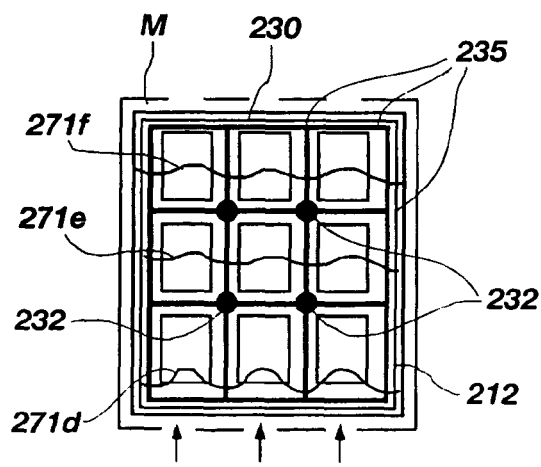
FIG. 8D illustrates modification of the flow fronts of FIG. 8C using a grid structure including baffles according to an embodiment of the present invention.

In a particular embodiment, insert 230 may be designed for modifying the flow of resin 270, where resin 270 is injected on one side of substrate 210, such as shown in FIG. 8D. In other embodiments, resin 270 may be injected from multiple sides of substrate 210 or from above it. Insert 230 may be modified accordingly to restrict the flow of resin 270 between semiconductor dice 260. In other embodiments, where semiconductor dice 260 are not arrayed in a matrix, then insert 230 may be configured to accommodate the arrangement of the semiconductor dice 260. Baffles 235 may be arced or stepped as necessary, and may be configured with comb-like protrusions as previously described with respect to FIG. 6A to impede, but not prevent, resin flow through a particular area.

Embodiments of insert 230 may be attached to substrate 210 by a wide variety of means such as by an adhesive or by mechanically interlocking with substrate 210. Substrate 210 may be modified to mechanically interlock with an embodiment of insert 230. In a particular embodiment, insert 230 includes pins 232, which extend below the bottom surfaces of insert 230 and are operable for mating with corresponding holes formed in substrate 210. Insert 230 may be designed to mate with or mount to substrate 210 by resting upon substrate 210 and being affixed thereto by adhesive or mechanical means as noted, by being compressed between substrate 210 and a wall of the mold cavity extending thereover, or by engaging with side walls of the mold cavity.

Figure 10A:
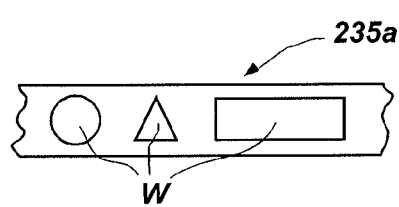
FIGS. 10A through 10D illustrate various baffle configurations suitable for use in the grid structure of FIG. 9.

In an embodiment where insert 230 is held in place by substantially continuous contact of the insert 230 with a wall of a mold member and a surface of substrate 210, it may be desirable to have suitably sized and configured windows W, as variously depicted in FIG. 10A, formed in the baffles 235 to act as flow restrictors. In one such embodiment, the resin 270 allowed to flow across substrate 210 would be controlled by the windows W in baffles 235. In that embodiment, baffles 235 would essentially form individual chambers around each semiconductor die 260.

Figure 9:
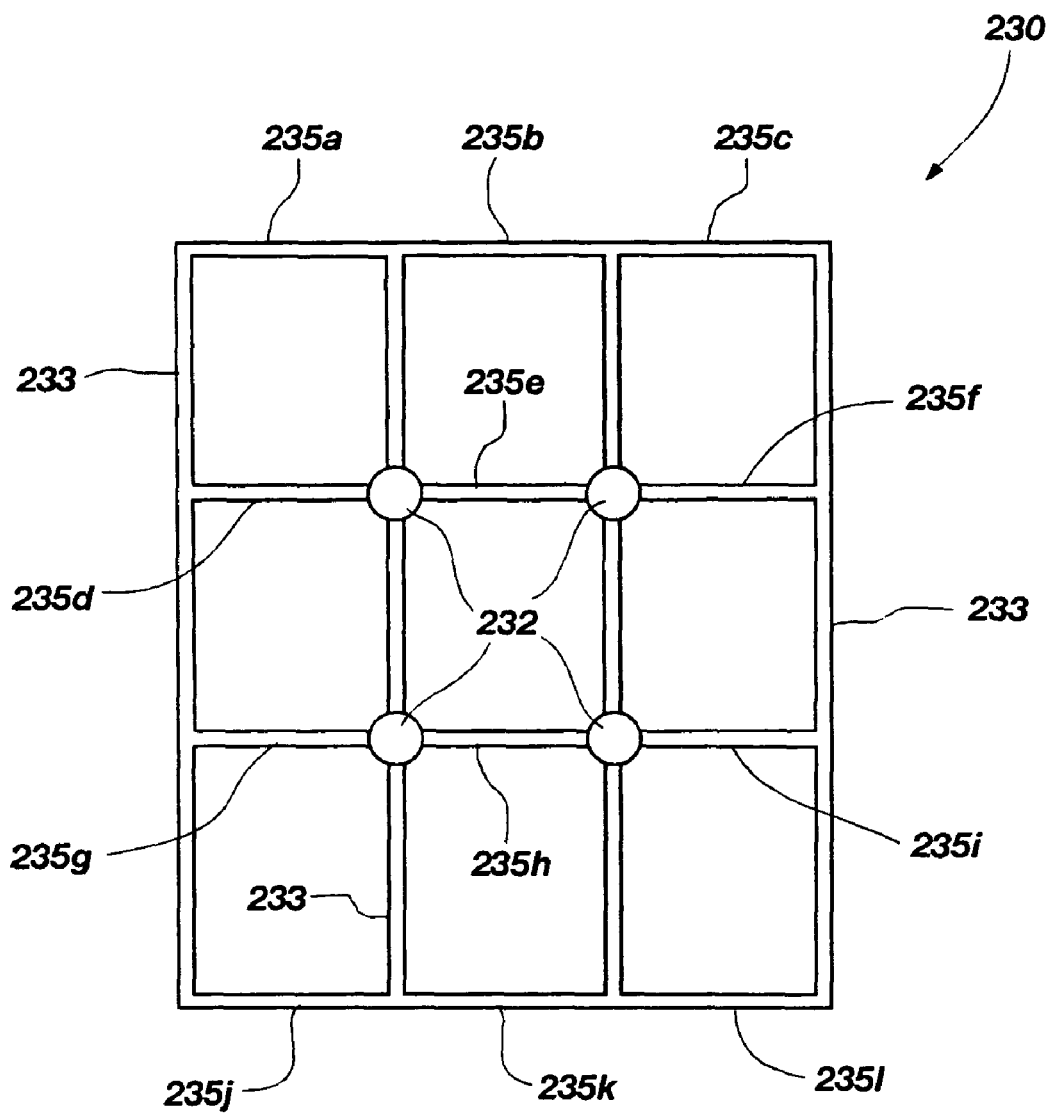
FIG. 9 is an enlarged view of a grid structure including baffles, as employed in the embodiment shown in FIG. 8D.

FIG. 9 illustrates an enlarged view of the embodiment of insert 230 shown in FIG. 8D. Baffles 235 may include baffles 235$a$ through 235$l$, as shown in FIG. 9. An insert 230 may include any number of baffles 235, adapted to the number of semiconductor dice 260 mounted to substrate 210. Insert 230 may, optionally, include a plurality of peripheral structural supports 233. The structural supports 233 may interconnect outer ends of the different baffles 235 to each other and support the baffles 235. Structural supports 233 may be any structure adapted for supporting baffles 235. For example, structural supports 233 may comprise a wall, a rod, or a wire. Structural supports 233 may be similar or identical to baffles 235. Additionally, some of the structural supports 233 may not present, such as around the perimeter of insert 230.

Figure 10B:
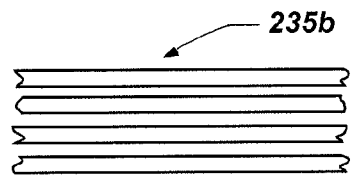
Figure 10C:
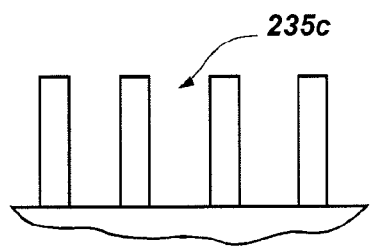
Figure 10D:
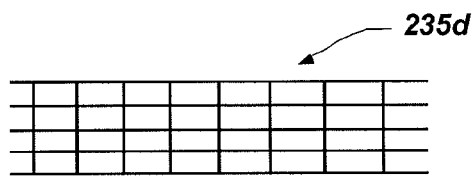

In a particular embodiment, baffles 235 are thin walls of rectangular cross-section and of lesser height than a distance between a surface of substrate 210 and the wall of a mold member extending thereover. In other embodiments, baffles 235 may exhibit a trapezoidal or a triangular cross-section, or any other geometric shape. Baffles 235 may also comprise horizontal rods as depicted in FIG. 10B, or laterally spaced vertical posts or struts as depicted in FIG. 10C, horizontally or vertically oriented spaced wires, wire mesh as depicted in FIG. 10D, or combinations thereof. Baffles 235 may comprise any structure suitable for retarding or directing the flow of a resin 270. Baffles 235 may have any height, width, or thickness necessary. Baffles 235 may specifically include, without limitation, any of the structures discussed with respect to baffles 175, 165, 135, 55, 35, or 25.

Embodiments of insert 230 encompass any structure or structures that may be placed on or attached to a substrate 210 and used to modify the configuration of flow front 271 of resin 270. In a particular embodiment, baffles 235 are not interconnected to each other.

Insert 230 may be designed to handle any arrangement of semiconductor dice 260 and is not limited to an array of rows and columns of dice as shown. When it is desirable to only modify a portion of a flow front 271, some baffles 235 may be removed or additional baffles 235 added. For example, due to mold variations, perhaps baffles 235$c$, 235$f$, 235$i$, and 235$l$ may not be necessary. Alternatively, baffles 235$c$, 235$f$, 235$i$, and 235$l$ may be designed to create less of a restriction than the other baffles 235, such as by reducing the height of those baffles. If increased restriction is desired, then, for example, an additional baffle 235 may be placed between baffles 235$g$ and 235$j$. Or, the height of the appropriate baffles may be increased. Baffles 235, with or without structural supports 233, may be placed anywhere on substrate 210.

In some embodiments, insert 230 may be integral to substrate 210. In a particular embodiment, substrate 210 is a circuit board and baffles 235 are ridges or posts extending from the top surface of substrate 210. Any baffle 235 structure operable to retard the flow of resin 270 may be incorporated into a circuit board. Where substrate 210 provides structural support for baffles 235, then structural supports 233 may not be necessary.

Similar to how short-shotting was previously discussed herein with respect to lead frames, short-shotting may also be utilized as an analytical technique with substrates 210. A prematurely stopped flow of resin 270 may be evaluated to determine if a flow front 271 needs to be modified by an insert 230, or if an existing insert requires reconfiguration. An insert 230 may then be designed to meet the needs of a certain mold, semiconductor dice and substrate combination, which generates undesirable flow fronts 271.

Insert 230 may be made of any material compatible with retarding the flow of a resin 270, such as a metal, a stiff polymer, or a glass fiber laminate.

In a particular embodiment, insert 230 is left in resin 270 while resin 270 cures. Insert 230 may be destroyed whenever the semiconductor dice 260 are separated or singulated from each other, such as by sawing or dicing. In another embodiment, insert 230 is removed prior to complete curing of resin 270 and may be reused. The same insert 230 may also be used for directing injection of multiple resins 270, such as an underfill resin followed by an encapsulating resin.

Embodiments of the present invention may be utilized with wire bonding technologies, chip-on-board technology, board-on-chip technology, flip-chip technology, tape-automated bonding technology, BGA technology (including chip scale packages), multichip module technology, or any other packaging technology utilizing lead frames or other substrates in conjunction with encapsulating a semiconductor dice in a molding compound.

Examples of packages that may utilize embodiments of the present invention include: quad flat packages, low profile quad flat packages, thin quad flat packages, quad flat packages, no-lead thin small outline packages, thin shrink small outline packages, small outline packages, shrink small outline packages, dual in-line packages, shrink dual in-line packages, single in-line packages, shrink single in-line packages, and shrink zig-zag in-line packages.

Semiconductor dice 60 may be any type of dice and may be used for any application, as packaged in accordance with embodiments of the invention. Embodiments of the present invention may be used not only with semiconductor devices, but with other devices such as passive filters, detector arrays, and MEMS devices.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes that fall within the meaning and range of equivalency of the claims are embraced within the scope thereof.

What is claimed is:

1. A method of packaging at least one semiconductor die, the method comprising:
    flowing an encapsulation compound in a mold cavity against at least one semiconductor die disposed within the mold cavity and in a direction toward sides of the at least one semiconductor die substantially parallel to a direction of flow of the encapsulation compound; and
    impeding flow of the encapsulation compound around at least one of the sides of the at least one semiconductor die substantially parallel to a direction of flow of the encapsulation compound.

2. The method of claim 1, further comprising directing a portion of the flow of the encapsulation compound across a top surface of the at least one semiconductor die.

3. The method of claim 1, further comprising directing a portion of the flow of the encapsulation compound across a bottom surface of the at least one semiconductor die.

4. The method of claim 1, wherein impeding flow of the encapsulation compound around the at least one of the sides of the at least one semiconductor die comprises using a member of a lead frame associated with the at least one semiconductor die as a barrier.

5. The method of claim 1, wherein impeding flow of the encapsulation compound around the at least one of the sides of the at least one semiconductor die comprises using a structure positionally secured within a mold cavity in which the at least one semiconductor die is disposed as a barrier to the flow.

6. The method of claim 5, further comprising securing the structure to a substrate to which the at least one semiconductor die is mounted.

7. The method of claim 5, further comprising securing the structure between a substrate to which the at least one semiconductor die is mounted and a wall of the mold cavity.

8. A method of packaging a plurality of semiconductor dice, the method comprising:
    attaching an array of semiconductor dice to a substrate;
    placing a flow diverting structure within a cavity of a discrete mold structure;
    attaching the flow diverting structure to the substrate;
    flowing a molding compound across the substrate; and
    modifying a flow front of the molding compound to impede flow of the molding compound between laterally separated semiconductor dice of the array and redirect flow of the molding compound over the semiconductor dice.

9. The method of claim 8, wherein flowing the molding compound across the substrate comprises flowing the molding compound across the substrate in substantially one direction.

* * * * *